United States Patent
Min

(10) Patent No.: US 10,735,663 B2
(45) Date of Patent: Aug. 4, 2020

(54) IMAGE SENSING DEVICE AND OPERATING METHOD THEREOF

(71) Applicant: SK hynix Inc., Gyeonggi-do (KR)

(72) Inventor: Chang-Ki Min, Seoul (KR)

(73) Assignee: SK hynix Inc., Icheon-si (KR)

( * ) Notice: Subject to any disclaimer, the term of this patent is extended or adjusted under 35 U.S.C. 154(b) by 43 days.

(21) Appl. No.: 16/219,674

(22) Filed: Dec. 13, 2018

(65) Prior Publication Data

US 2019/0306398 A1    Oct. 3, 2019

(51) Int. Cl.
*H04N 5/235* (2006.01)
*H01L 27/146* (2006.01)
*H03K 19/1776* (2020.01)

(52) U.S. Cl.
CPC ..... *H04N 5/2353* (2013.01); *H01L 27/14605* (2013.01); *H03K 19/1776* (2013.01)

(58) Field of Classification Search
CPC .................................................. H04N 5/2356
USPC ...................................... 348/221.1, 254, 362
See application file for complete search history.

(56) References Cited

U.S. PATENT DOCUMENTS

| | | | | |
|---|---|---|---|---|
| 9,871,965 B2* | 1/2018 | Dabral | ............... | H04N 5/23232 |
| 2008/0253758 A1* | 10/2008 | Yap | .................. | G03B 7/08 |
| | | | | 396/234 |
| 2009/0295941 A1* | 12/2009 | Nakajima | ............... | G06T 5/009 |
| | | | | 348/229.1 |
| 2011/0007182 A1* | 1/2011 | Yamada | ............... | H04N 1/4074 |
| | | | | 348/224.1 |
| 2018/0097983 A1* | 4/2018 | Park | .................. | H04N 5/23277 |

FOREIGN PATENT DOCUMENTS

| KR | 10-1026585 B1 | 3/2011 |
|---|---|---|
| KR | 10-1473597 B1 | 12/2014 |

* cited by examiner

*Primary Examiner* — Anthony J Daniels
(74) *Attorney, Agent, or Firm* — Perkins Coie LLP

(57) ABSTRACT

An image sensing device includes an image sensor that converts incident light into a first image by operating the image sensor under a first exposure time and a second image by operating the image sensor under a second exposure time which is different from the first exposure time; a calculation circuit to receive the first image and generate a third image corresponding to the second image based on the first image and a exposure ratio between the first and the second exposure times; a combination circuit to combine the second image and the third image to generate a combination image; a conversion circuit to convert or maintain each code value of the combination image to have the same bit depth based on the combination image and the exposure ratio; and a memory circuit coupled to the conversion circuit to store image values outputted from the conversion circuit.

20 Claims, 2 Drawing Sheets

IMAGE SENSING DEVICE AND OPERATING METHOD THEREOF

CROSS-REFERENCE TO RELATED APPLICATIONS

This patent document claims the priority to and benefits of Korean Patent Application number 10-2018-0036864, filed on Mar. 29, 2018, in the Korean Intellectual Property Office, the disclosure of which is incorporated herein by reference in its entirety.

TECHNICAL FIELD

The technology and implementations disclosed in this patent document generally relate to a semiconductor design technique for an electronic device including an image sensing device.

BACKGROUND

Image sensing devices capture images using photosensitive properties of semiconductors. Image sensing devices are often classified into charge-coupled device (CCD) image sensors and complementary metal-oxide semiconductor (CMOS) image sensors. CMOS image sensors may be fabricated by integrating both analog and digital control circuits in a single integrated circuit (IC). CMOS image sensors are widely used in many applications.

SUMMARY

This patent document provides, among others, designs of an image sensing device capable of reducing the use of memory resources, and an operating method of the image sensing device.

In accordance with an embodiment of the disclosed technology, an image sensing device includes: an image sensor that captures incident light and converts the incident light into a first image by operating the image sensor under a first exposure time and a second image by operating the image sensor under a second exposure time which is different from the first exposure time; a calculation circuit coupled to the image sensor to receive the first image and generate a third image corresponding to the second image based on the first image and a exposure ratio between the first and the second exposure times; a combination circuit coupled to the image sensor and the calculation circuit to combine the second image and the third image to generate a combination image; a conversion circuit coupled to the combination circuit to convert or maintain each code value of the combination image to have the same bit depth based on the combination image and the exposure ratio; and a memory circuit coupled to the conversion circuit to store image values outputted from the conversion circuit.

The same bit depth may include a smallest bit depth among two or more bit depths of the code values.

The conversion circuit may include: a signal generator coupled to the combination circuit to receive the combination image signal to generate flag signals corresponding to the code values of the combination image signal based on a comparison between the code values of the combination image signal and a predetermined threshold value; and a signal processor coupled to the signal generator to generate the image values based on the code values of the combination image signal, the flag signals and the exposure ratio.

The signal generator may compare each of the code values of the combination image signal with the threshold value and may generate each of the flag signals corresponding to a result of the comparison.

The signal processor may output each of the code values of the combination image signal as each of the image values or may compress each of the code values of the combination image signal at the exposure ratio to output as each of the image values, based on each of the flag signals.

The signal processor may include a divider for dividing each of the code values of the combination image signal by the exposure ratio based on each of the flag signals.

The memory circuit may store logic values of the flag signals.

The image sensing device of claim further include: a tone mapping circuit coupled to the memory circuit to decompress the image values to the code values of the combination image signal based on the image values and the flag signals to generate decompressed code values and configured to perform a tone mapping operation based on the decompressed code values.

The calculation circuit may include a multiplier for multiplying the first image by the exposure ratio.

The first exposure time may include a short exposure time, and the second exposure time includes a long exposure time.

The exposure ratio may correspond to a result obtained by dividing the second exposure time by the first exposure time.

In accordance with an embodiment of the disclosed technology, an operating method of an image sensing device includes: generating a first image corresponding to a short exposure time of the image sensing device and a second image corresponding to a long exposure time of the image sensing device; generating a third image corresponding to the second image based on the first image to render code values of the third image to have a greater bit depth than a bit depth of the first image or the second image; generating a combination image by combining the second image and the third image; generating flag signals corresponding to code values of the combination image based on a comparison between the code values and a predetermined threshold value; generating image values by compressing some or all of the code values of the combination image signal based on the flag signals and the exposure ratio; and storing the image values and logic values of the flag signals.

Generating the third image may include multiplying the first image by the exposure ratio, and generating the image values may include dividing some or all of the code values by the exposure ratio based on the flag signals.

The operating method further include: generating decompressed code values corresponding to the code values by decompressing some or all of code values of the image values based on the flag signals and the exposure ratio; and performing a tone mapping operation based on the decompressed code values.

Generating the decompressed code values may include multiplying some or all of the image values by the exposure ratio.

The exposure ratio may correspond to a result obtained by dividing the long exposure time by the short exposure time.

In accordance with an embodiment of the disclosed technology, an image sensing device includes: a pixel array of photosensing pixels arranged in rows and columns to respond to incident light to output pixel signals representing a detected image carried by the incident light; a combination circuit coupled to the pixel array to combine detected images that are captured by the pixel array with different exposure times; a conversion circuit coupled to the combination circuit to receive the combination image to generate flag signals corresponding to code values of the combination image based on a comparison between the code values of the combination image and a predetermined threshold value, and configured to generate image values based on the code values of the combination image, the flag signals and the exposure ratio; a memory circuit coupled to the conversion circuit to store the image values output from the conversion circuit; and a tone mapping circuit coupled to the memory circuit to decompress the image values to the code values of the combination image signal based on the image values and the flag signals to generate decompressed code values and configured to perform a tone mapping operation based on the decompressed code values.

The conversion circuit may compare each of the code values of the combination image signal with the predetermined threshold value and may generate each of the flag signals corresponding to a result of the comparison.

The conversion circuit may output each of the code values of the combination image signal as each of the image values or may compress each of the code values of the combination image signal at the exposure ratio to output a compressed code value as each of the image values, based on each of the flag signals.

The conversion circuit may include a divider for dividing each of the code values of the combination image signal by the exposure ratio based on each of the flag signals.

Those embodiments and other aspects of the disclosed technology are described in detail in the drawings, the description and the claims.

DETAILED DESCRIPTION

Various features and embodiments of the disclosed technology are described below with reference to the accompanying drawings.

Moreover, it is noted that the terminology used herein is selected for the purpose of describing the examples of the disclosed technology only and is not intended to limit the illustrated examples.

The drawings are not necessarily to scale and, in some instances, proportions may have been exaggerated in order to clearly illustrate features of the embodiments.

Figure 1:
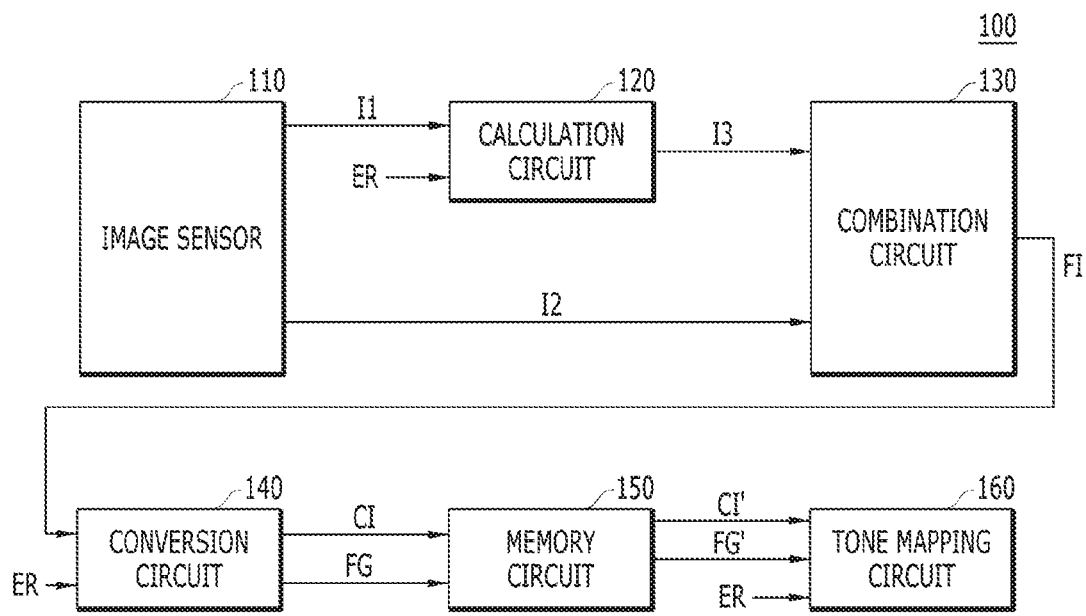
FIG. 1 is a block diagram illustrating an example of an image sensing device implemented based on an embodiment of the disclosed technology.

FIG. 1 is a block diagram illustrating an example of an image sensing device 100 implemented based on an embodiment of the disclosed technology.

Referring to FIG. 1, the image sensing device 100 may include an image sensor 110, a calculation circuit 120, a combination circuit 130, a conversion circuit 140, a memory circuit 150, and a tone mapping circuit 160.

The image sensor 110 may be designed to capture incident light that represents a subject or a scene as an image, and to convert the incident light into an image as a representation of the captured scene. The image sensor 110 may generate a first image I1 corresponding to a "short" exposure time of the image sensor 110 and a second image I2 corresponding to a "long" exposure time of the image sensor 110. In some embodiments of the disclosed technology, the image sensor 110 may capture a high dynamic range by providing two or more images for each image frame, with changing exposure. For example, the image sensor 110 may generate an image at a short exposure time ("short") and another image at a longer exposure time ("long"). The image sensor 110 may include an array of photosensing pixels to produce, respectively, pixel signals representing light received by the pixels. The first image I1 may include first code values that are generated based on pixel signals collectively forming the first image I1, and the second image I2 may include second code values that are generated based on pixel signals collectively forming the second image I2. The first and second code values may have the same bit depth (hereinafter referred to as a "first bit depth").

The calculation circuit 120 may generate a third image I3 corresponding to the second image I2 based on the first image I1 and a predetermined exposure ratio ER. For example, the calculation circuit 120 may include a multiplier for multiplying the first image I1 by the exposure ratio ER to generate the third image I3. An exposure time domain of the second image I2 may coincide with an exposure time domain of the third image I3. The third image I3 may include third code values which may have an increased bit depth compared to the first and second code values (hereinafter referred to as a "second bit depth"). When the first code value has 10 bits and the exposure ratio ER is 16(=2^4) times, the third code value may have 14(=10+4) bits. The exposure ratio ER may refer to a ratio of the short exposure time to the long exposure time and be defined by Equation 1 as follows.

$$ER = \frac{LongEXP \cdot Time}{ShortEXP \cdot Time} \qquad \text{[Equation 1]}$$

Here, "LongEXP.Time" may refer to the long exposure time, and "ShortEXP.Time" may refer to the short exposure time. As discussed above, when providing two or more images for each image frame, with changing exposure, the short exposure time may indicate an exposure time that is shorter than the long exposure time. The exposure ratio ER may correspond to a result obtained by dividing the long exposure time LongEXP.Time by the short exposure time ShortEXP.Time.

The combination circuit 130 may combine the second image I2 and the third image I3 to generate a combination image FI. For example, the combination circuit 130 may determine whether or not each of the third code values of the third image I3 corresponds to a saturation area. When each of the third code values of the third image I3 is determined as being corresponding to the saturation area, the third code values may be selected as code values of the combination image FI. When each of the third code values of the third image I3 does not correspond to the saturation area, the second code values may be selected as the code values of the combination image FI. Accordingly, a bit depth of each of the code values of the combination image FI may be any one of the first bit depth and the second bit depth.

The conversion circuit 140 may covert or maintain each of the code values of the combination image FI so that the code values of the combination image FI have the same bit depth, based on the combination image FI and the exposure ratio ER. The conversion circuit 140 may generate image values CI and generate flag signals FG indicating whether or not each of the code values of the combination image FI is converted. Here, the image values CI may indicate code values that have been converted or maintained from the code values of the combination image FI. The same bit depth may be the first bit depth, which is the smallest bit depth among the first bit depth and the second bit depth of the code values of the combination image FI.

The memory circuit 150 may store the image values CI and the flag signals FG. For example, the memory circuit 150 may store the image values each having 10 bits and the flag signals each having 1 bit.

Based on image values CI' and flag signals FG' stored in the memory circuit 150, the tone mapping circuit 160 may decompress the image values CI' to restore the code values of the combination image FI, and may also perform a tone mapping operation based on the decompressed code values.

Figure 2:
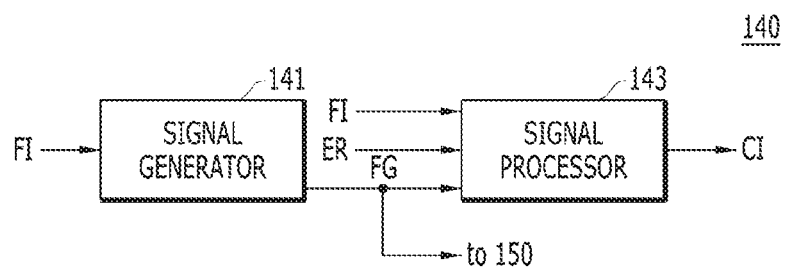
FIG. 2 is a block diagram illustrating an example of a conversion circuit implemented based on an embodiment of the disclosed technology.

FIG. 2 is a block diagram illustrating an example of an implementation of the conversion circuit 140 shown in FIG. 1.

Referring to FIG. 2, the conversion circuit 140 may include a signal generator 141 and a signal processor 143.

The signal generator 141 may generate the flag signals FG corresponding to the code values of the combination image FI based on the code values of the combination image FI and a threshold value. More specifically, the signal generator 141 may compare each of the code values with the threshold value and generate the flag signals FG corresponding to results of the comparison. For example, each of the flag signals FG may be generated to have a logic value of "1" when each of the code values is greater than the threshold value, and each of the flag signals FG may be generated to have a logic value of "0" when each of the code values is smaller than the threshold value. The threshold value may be stored in the signal generator 141 or be provided from an external device. The threshold value may be a reference value for determining the saturation area and the other areas.

The signal processor 143 may generate the image values CI based on the code values of the combination image FI, the flag signals FG, and the exposure ratio ER. More specifically, the signal processor 143 may output each of the code values as each of the image values CI or may compress each of the code values at the exposure ratio ER and output the compressed code values as each of the image values CI, based on each of the flag signals. For example, the signal processor 143 may include a divider for dividing each of the code values of the combination image FI by the exposure ratio ER based on each of the flag signals.

Hereinafter, an operation of the image sensing device 100 implemented based on an embodiment of the disclosed technology is described with reference to FIG. 3.

Figure 3:
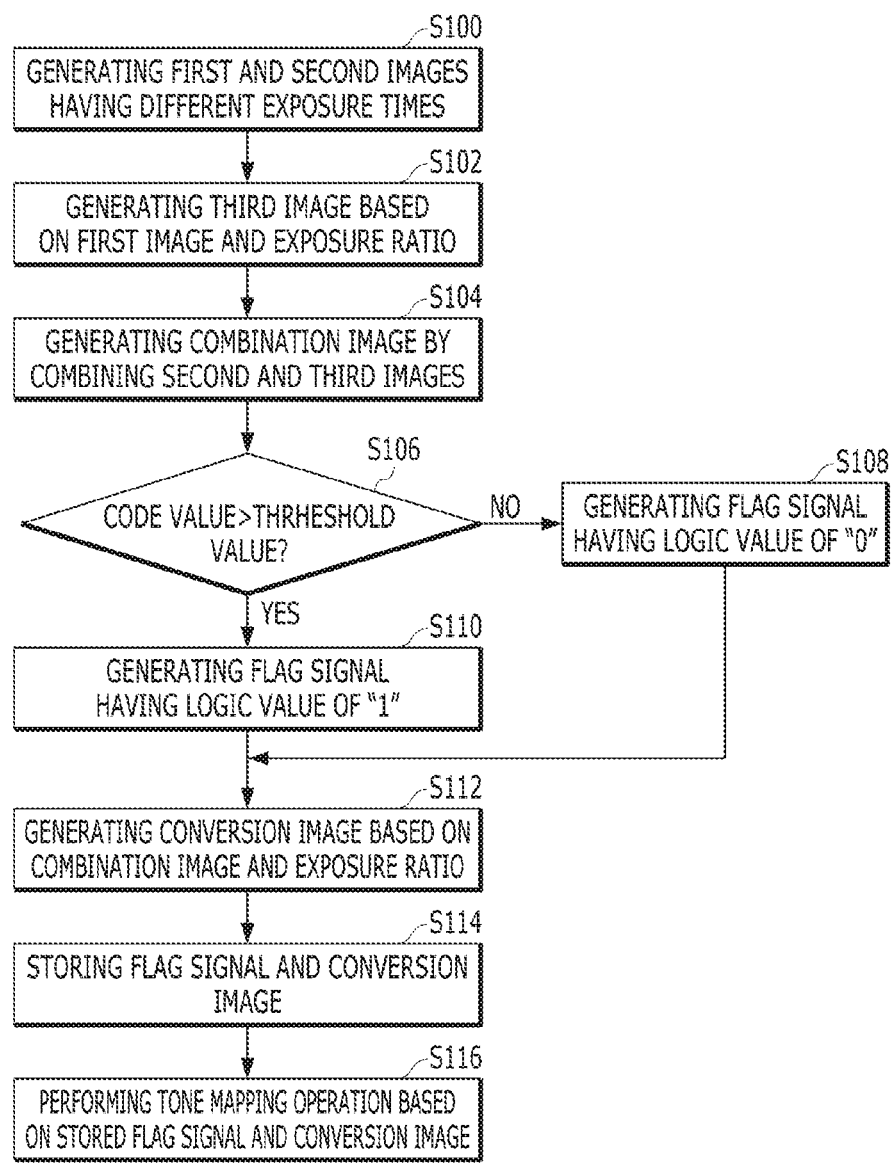
FIG. 3 is a flowchart illustrating an example operation of an image sensing device implemented based on an embodiment of the disclosed technology.

FIG. 3 is a flowchart illustrating an example operation of the image sensing device 100 shown in FIG. 1 under one implementation.

Referring to FIG. 3, the operation of the image sensing device 100 may include generating the first image I1 corresponding to the short exposure time and the second image I2 corresponding to the long exposure time in step S100, generating the third image I3 corresponding to the second image I2 based on the first image I1 and the predetermined exposure ratio ER in step S102, generating the combination image FI by combining the second image I2 and the third image I3 in step S104, generating the flag signals FG corresponding to the code values of the combination image FI based on the code values of the combination image FI and the predetermined threshold value in step S106, S108 and S110, storing the image values CI and the logic values of the flag signal FG in step S114, and performing the tone mapping operation based on the image values CI' and the flag signals FG' in step S116.

In step S102, the third image I3 may be generated by multiplying the first image I1 by the exposure ratio ER. In step S112, the image values CI may be generated by dividing some or all of the code values of the combination image FI by the exposure ratio ER based on the flag signals FG.

The generation of the flag signals FG may include comparing each of the code values of the combination image FI with the threshold value in step S106, and generating each of the flag signals having a logic value of "0" or a logic value of "1" based on results of the comparison in step S108 and S110.

Although not illustrated, the tone mapping operation in step S116 may include decompressing some or all of the image values CI to generate the decompressed code values corresponding to the code values of the combination image FI based on the flag signals FG and the exposure ratio ER, and performing the tone mapping operation based on the decompressed code values.

When decompressing some or all of the image values CI to generate the decompressed code values, the decompressed code values may be generated by multiplying some or all of the image values CI by the exposure ratio ER.

In an embodiment of the disclosed technology, an image sensing device includes a pixel array of photosensing pixels arranged in rows and columns to respond to incident light to output an image, a combination circuit coupled to the pixel array to combine a set of image signals that has been captured with different exposure times including long and short exposure times to generate a combination image, a conversion circuit coupled to the combination circuit to receive the combination image to generate flag signals corresponding to code values of the combination image based on a comparison between the code values of the combination image and a predetermined threshold value, and configured to generate image values based on the code values of the combination image, the flag signals and the exposure ratio, a memory circuit coupled to the conversion circuit to store the image values output from the conversion circuit, and a tone mapping circuit coupled to the memory circuit to decompress the image values to the code values of the combination image based on the image values and the flag signals to generate decompressed code values and configured to perform a tone mapping operation based on the decompressed code values.

In some embodiments of the disclosed technology, as a combination image having an increased bit depth is compressed and stored, the use of memory resources may be reduced.

As the use of memory resources is reduced, it may be easy to implement a hardware design in a smaller area.

In some embodiments of the disclosed technology, an implantation process and/or a deep trench isolation formation process for optical and electrical insulation between the unit pixels can be omitted and/or skipped. Accordingly, a dark current, a hot pixel effect, a dark shading effect, and other unintended effects of the unit pixels of the image sensor can be decreased and suppressed. Furthermore, sizes of the unit pixels of the image sensor can be downsized, and a resolution of the image sensor can be improved.

While the disclosed technology has been described with respect to the specific examples and embodiments, the disclosed technology can be implemented in various ways beyond the specifics of the examples and embodiments described herein.

What is claimed is:

1. An image sensing device, comprising:
an image sensor that captures incident light and converts the incident light into a first image by operating the image sensor under a first exposure time and a second image by operating the image sensor under a second exposure time which is different from the first exposure time;
a calculation circuit coupled to the image sensor to receive the first image and generate a third image corresponding to the second image based on the first image and a exposure ratio between the first and the second exposure times;
a combination circuit coupled to the image sensor and the calculation circuit to combine the second image and the third image to generate a combination image;
a conversion circuit coupled to the combination circuit to convert or maintain each code value of the combination image to have the same bit depth based on the combination image and the exposure ratio; and
a memory circuit coupled to the conversion circuit to store image values outputted from the conversion circuit.

2. The image sensing device of claim 1, wherein the same bit depth includes a smallest bit depth among two or more bit depths of the code values.

3. The image sensing device of claim 1, wherein the conversion circuit includes:
a signal generator coupled to the combination circuit to receive the combination image signal to generate flag signals corresponding to the code values of the combination image signal based on a comparison between the code values of the combination image signal and a predetermined threshold value; and
a signal processor coupled to the signal generator to generate the image values based on the code values of the combination image signal, the flag signals and the exposure ratio.

4. The image sensing device of claim 3, wherein the signal generator compares each of the code values of the combination image signal with the threshold value and generates each of the flag signals corresponding to a result of the comparison.

5. The image sensing device of claim 3, wherein the signal processor outputs each of the code values of the combination image signal as each of the image values or compresses each of the code values of the combination image signal at the exposure ratio to output as each of the image values, based on each of the flag signals.

6. The image sensing device of claim 3, wherein the signal processor includes a divider for dividing each of the code values of the combination image signal by the exposure ratio based on each of the flag signals.

7. The image sensing device of claim 3, wherein the memory circuit stores logic values of the flag signals.

8. The image sensing device of claim 3, further comprising:
a tone mapping circuit coupled to the memory circuit to decompress the image values to the code values of the combination image signal based on the image values and the flag signals to generate decompressed code values and configured to perform a tone mapping operation based on the decompressed code values.

9. The image sensing device of claim 1, wherein the calculation circuit includes a multiplier for multiplying the first image by the exposure ratio.

10. The image sensing device of claim 1, wherein the first exposure time includes a short exposure time, and the second exposure time includes a long exposure time.

11. The image sensing device of claim 1, wherein the exposure ratio corresponds to a result obtained by dividing the second exposure time by the first exposure time.

12. An operating method of an image sensing device, comprising:
generating a first image corresponding to a short exposure time of the image sensing device and a second image corresponding to a long exposure time of the image sensing device;
generating a third image corresponding to the second image based on the first image to render code values of the third image to have a greater bit depth than a bit depth of the first image or the second image;
generating a combination image by combining the second image and the third image;
generating flag signals corresponding to code values of the combination image based on a comparison between the code values and a predetermined threshold value;
generating image values by compressing some or all of the code values of the combination image signal based on the flag signals and the exposure ratio; and
storing the image values and logic values of the flag signals.

13. The operating method of claim 12, wherein generating the third image includes multiplying the first image by the exposure ratio, and generating the image values includes dividing some or all of the code values by the exposure ratio based on the flag signals.

14. The operating method of claim 12, further comprising:
generating decompressed code values corresponding to the code values by decompressing some or all of code values of the image values based on the flag signals and the exposure ratio; and
performing a tone mapping operation based on the decompressed code values.

15. The operating method of claim 14, wherein generating the decompressed code values includes multiplying some or all of the image values by the exposure ratio.

16. The operating method of claim 12, wherein the exposure ratio corresponds to a result obtained by dividing the long exposure time by the short exposure time.

17. An image sensing device, comprising:
a pixel array of photosensing pixels arranged in rows and columns to respond to incident light to output pixel signals representing a detected image carried by the incident light;
a combination circuit coupled to the pixel array to combine detected images that are captured by the pixel array with different exposure times;
a conversion circuit coupled to the combination circuit to receive the combination image to generate flag signals corresponding to code values of the combination image based on a comparison between the code values of the combination image and a predetermined threshold value, and configured to generate image values based on the code values of the combination image, the flag signals and the exposure ratio;
a memory circuit coupled to the conversion circuit to store the image values output from the conversion circuit; and a tone mapping circuit coupled to the memory circuit to decompress the image values to the code values of the combination image signal based on the image values and the flag signals to generate decompressed code values and configured to perform a tone mapping operation based on the decompressed code values.

18. The image sensing device of claim 17, wherein the conversion circuit compares each of the code values of the combination image signal with the predetermined threshold value and generates each of the flag signals corresponding to a result of the comparison.

19. The image sensing device of claim 17, wherein the conversion circuit outputs each of the code values of the combination image signal as each of the image values or compresses each of the code values of the combination image signal at the exposure ratio to output a compressed code value as each of the image values, based on each of the flag signals.

20. The image sensing device of claim 17, wherein the conversion circuit includes a divider for dividing each of the code values of the combination image signal by the exposure ratio based on each of the flag signals.

* * * * *